United States Patent [19]

Harris et al.

[11] Patent Number: 5,596,171
[45] Date of Patent: Jan. 21, 1997

[54] PACKAGE FOR A HIGH FREQUENCY SEMICONDUCTOR DEVICE AND METHODS FOR FABRICATING AND CONNECTING THE SAME TO AN EXTERNAL CIRCUIT

[76] Inventors: James M. Harris, Rte. 4, Box 240, Terrell, Tex. 75160; Brigitte U. Kiba, 3801 E. 14th St. #401, Plano, Tex. 75074; Porter B. Click, Jr., 612 Mt. Vernon Pl., Garland, Tex. 75043

[21] Appl. No.: 254,977

[22] Filed: Jun. 7, 1994

Related U.S. Application Data

[62] Division of Ser. No. 65,579, May 21, 1993, abandoned.

[51] Int. Cl.$^6$ .................................. H01L 23/02
[52] U.S. Cl. .................... 174/52.4; 257/664; 257/704; 257/728
[58] Field of Search .................. 430/311, 313, 430/314, 318; 174/52.1–52.4; 257/664, 665, 687, 704, 728, 784; 437/209

[56] References Cited

U.S. PATENT DOCUMENTS

| | | | |
|---|---|---|---|
| 3,517,279 | 6/1970 | Ikeda et al. | 317/234 |
| 3,681,513 | 8/1972 | Hargis | 174/52 S |
| 3,768,157 | 10/1973 | Buie | 29/613 |
| 3,784,884 | 1/1974 | Zoroglu | 317/234 |
| 3,836,993 | 9/1974 | Joshi | 357/27 |
| 3,913,040 | 10/1975 | Rosen et al. | 333/247 |
| 3,936,866 | 2/1976 | Grossman et al. | 257/717 |
| 3,961,415 | 6/1976 | Davis, Jr. | 29/591 |
| 3,986,196 | 10/1976 | Decker et al. | 357/22 |
| 4,150,393 | 4/1979 | Wilson et al. | 357/74 |
| 4,168,507 | 9/1979 | Yester, Jr. | 357/51 |
| 4,340,902 | 7/1982 | Honda et al. | 357/74 |
| 4,486,622 | 12/1984 | Dathe et al. | 174/52 |
| 4,538,124 | 8/1985 | Morrison | 333/246 |
| 4,618,879 | 10/1986 | Mizukoshi et al. | 357/74 |
| 4,737,236 | 4/1988 | Perko et al. | 156/644 |
| 4,739,389 | 4/1988 | Goedbloed | 257/664 |
| 4,779,338 | 10/1988 | Kohara et al. | 29/832 |
| 4,786,256 | 11/1988 | Angeleri et al. | 439/72 |
| 4,788,584 | 11/1988 | Hirano et al. | 357/81 |
| 4,839,712 | 6/1989 | Mamodaly et al. | 357/51 |
| 4,857,671 | 8/1989 | Nakano et al. | 174/68.5 |
| 4,891,686 | 1/1990 | Krausse, III | 174/252 |
| 4,922,324 | 5/1990 | Sudo | 257/700 |
| 4,946,733 | 8/1990 | Seeger, Jr. et al. | 428/209 |
| 4,962,415 | 10/1990 | Yamamoto et al. | 235/492 X |
| 5,014,159 | 5/1991 | Butt | 361/386 |
| 5,188,984 | 2/1993 | Nishiguchi | 437/211 |
| 5,258,647 | 11/1993 | Wojnarowski et al. | 257/687 |
| 5,297,333 | 3/1994 | Kusaka | 29/840 |
| 5,302,492 | 4/1994 | Ott et al. | 430/314 |
| 5,313,367 | 5/1994 | Ishiyama | 361/772 |
| 5,349,501 | 9/1994 | Kawakami | 361/776 |
| 5,359,227 | 10/1994 | Liang et al. | 257/784 |
| 5,371,321 | 12/1994 | Hamxehdoost et al. | 174/52.4 |
| 5,399,902 | 3/1995 | Bickford et al. | 257/659 |

*Primary Examiner*—Leo P. Picard
*Assistant Examiner*—C. Horgan
*Attorney, Agent, or Firm*—Harris, Tucker & Hardin, P.C.

[57] ABSTRACT

A package for a semiconductor die, particularly field effect transistors, operating at very high frequencies includes a base having integrally formed conductor supports. The base and the supports are formed from a thermo-formed or thermo-set plastic material. Metal conductors are plated to the supports and terminate in pads for connecting the die to an external circuit. A die is attached to the base and wires bonded to the package conductor pads. The surface of the die, the bond wires and the surface of the package conductors are substantially coplanar to reduce abrupt changes in the path of signal flow which reduces radiation losses. Package dimensions and conductor proximities and bond wire lengths are precisely located and enhanced to reduce parasitic inductances. When connected to an external circuit, the package is flipped and its lid inserted into a hole in the circuit board. The package conductors rest against the circuit board to the semiconductor device. The manufacture and assembly of the package is reliable and suited to commercial applications.

15 Claims, 5 Drawing Sheets

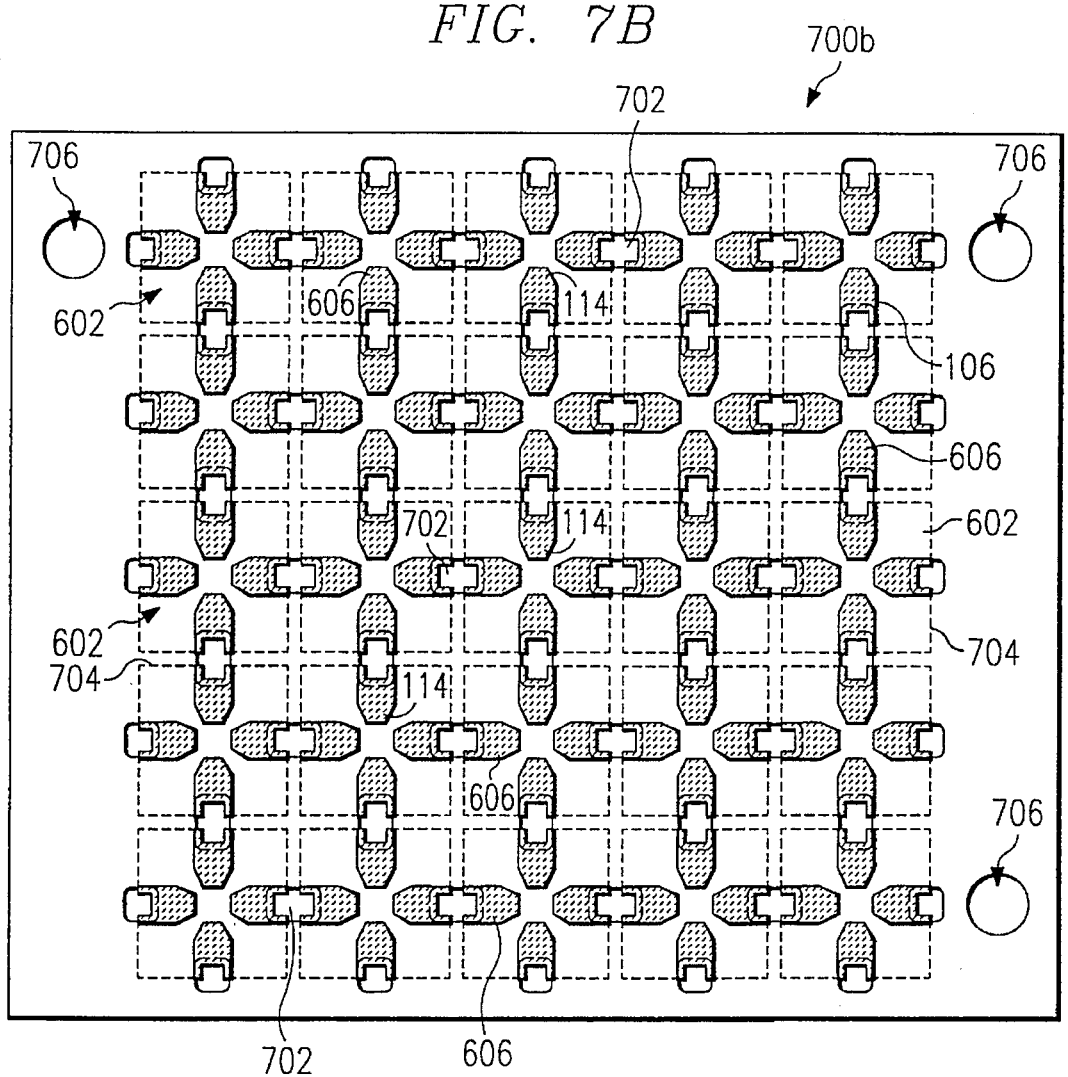

PACKAGE FOR A HIGH FREQUENCY SEMICONDUCTOR DEVICE AND METHODS FOR FABRICATING AND CONNECTING THE SAME TO AN EXTERNAL CIRCUIT

This application is a division, of application Ser. No. 08/065,579, filed May 21, 1993 abandoned.

FIELD OF THE INVENTION

The invention pertains generally to packages for high frequency semiconductor devices, and more particularly to a package for a Field Effect Transistor (FET), including a method for fabricating the package and a method for connecting the package to an external circuit.

BACKGROUND OF THE INVENTION

Electronic packaging is a method whereby a discrete semi-conductor device, or die, is encased to protect it from the environment and to provide easy connection of the die to an external circuit. Package materials are chosen for suitable electrical, mechanical or thermal properties. The die is then attached, wired and otherwise assembled into the package. Die such as FETs are widely used in commercial products such as microwave amplifiers, cellular telephones and satellite down-converters. High device performance, reliability and low cost packaging are desirable.

The optimum package for a particular die is determined, in pan, by the desired performance characteristics of the current where the die is used. The perfect electronic package can be described as one which is transparent to the die; a package that in no way alters a signal on entering or leaving the die. Any changes to the signal should be due solely to the action of the device inside. The perfect mechanical package must be compatible to die attachment and wire bonding techniques and must have low cost manufacture and easy connection to an external circuit.

Perfect packaging does not exist due to properties inherent to the package materials. These properties include inductance, capacitance and resistance that cause signal changes and they are known as "strays" or "parasitics." At higher frequencies, exceeding 200 KHz, strays cause serious degradation in signal performance. There are several examples of strays; high frequency currents in package conductors generate magnetic fluxes that create a counter current flow. Traditional package conductor leads are made of high-nickel steels which are poor electrical conductors and dissipate signal energy, referred to as "metal losses". The geometry or arrangement of the materials in the package and how it is attached to the circuit also alter the signal. When high frequency signals flow through the several interconnections between the package and the external circuit, the abrupt changes in physical and dimensional properties cause effects commonly referred to as "radiation losses". The non-conductors of the package have capacitance properties which alter the high frequency response of the applied signal.

Perfect packages are difficult to manufacture and use. Traditional ceramic packages with refractory metal bonds have good thermal and mechanical properties but are costly to fashion and undergo time-consuming single line fabrication process. Traditional packages also have non-precise dimensions. Printed and refractory fired packages with inherent thermal shrinkage have wide tolerances and cannot therefore optimize the proximity of package interfaces. Refractory packages also have wide variations in assembly location and electrical connections to external circuits.

SUMMARY OF THE INVENTION

The following summary is intended only to provide a general overview of the various aspects of the invention in its preferred embodiments, methods of manufacture and mode of use, and should not be construed as limiting scope of the invention to all of these aspects.

A package for a very high frequency microelectronic semiconductor device, such as a FET to be used in microwave and UHF circuits, includes a dielectric base. The base is fabricated from a thermo-set plastic, such as a di-functional brominated epoxy sheet filled with fiberglass weave, or thermo-formed plastic, such as random glass fiber filled poly-ether-imide sheet, capable of bonding to metal conductors. Plastic has low material cost and can be fashioned at inexpensive process temperatures as compared with traditional ceramic materials.

Supports are integrally formed on the base to hold metal conductors which electrically connect the device in the package to the external circuit. The size, shape and location of the conductor supports can be formed into the base by several methods, such as punching or molding. Layers of low resistance metals, such as copper, silver, nickel and gold, or alloys thereof, are bonded to the base and conductor supports by several methods, such as plating, vapor deposition or laminating. The term "plating" is used herein to generally refer to such methods. The conductor metals have free electron content such that they are highly conductive and avoid metal losses. Plating and etching resists, such as photo-resist, can be used to further define exact conductor dimensions by chemical milling.

The base with conductors is intended to support and electrically connect a semiconductor device or die. The package is built in an array, such as five rows of five bases, which enables the die attached equipment to step and repeat loading die onto each base. A die is attached to the base by one of several methods, such as epoxy bonding. Low thermal stresses inherent in the plastic allow a wide range of bond materials and thicknesses so that the die is reliably attached. The die is electrically connected to the conductors of the package with metal leads, such as gold wire wedge bonds. The package conductors are made from metals to which gold wire may be bonded. The impedance of the package conductors and wire bonds are substantially matched to the die and the external circuit by several methods, such as varying the number of bond wires or size of the conductors as well as using photographic processes to control the location and proximity of conductors. Minimizing the lengths of the bond wires and proximity of metal conductors reduces parasitic inductance and capacitance. The surface of the die, the bond wire contacts and the surface of the metal conductors are located substantially in the same plane to avoid abrupt physical discontinuities in the signal path through the package. This reduces high frequency radiation losses.

A plastic lid, overlaying the die and attached to the base to protect the die from the environment, is formed by one of several methods. These methods include molding or cold forming. The lid can be attached by several methods such as epoxy, solvent or ultrasonic bonding. Positive registration of the package during subsequent assembly to an external circuit is made by notching the lid, body or conductor. The package can thus be oriented for assembly by such techniques as automated vacuum pick-up tools.

The package is registered to an external circuit and electrically connected, such as by soldering the package conductors to the circuit conductors. Package conductors, such as copper with nickel and gold overlays, are selected for solder wettability during reflow bonding. Solder can be applied in mass by such techniques as screen printing in paste form, and reflow bonded at relatively low temperatures. The proper location and electrical connection of the package to the circuit significantly affects system performance. To avoid abruptness in the signal path between the package conductors and the external circuit, the circuit is designed to accept the package in the same plane as the circuit conductors. For example, the package is flipped and inserted lid down, into a hole formed in the circuit board. The surface of the metal conductors of the package meet and are thus substantially co-planar with the conductors, or transmission liens, on the circuit.

Test data on the packaged devices is fed back to the package manufacture and assembly process such that the process steps can be changed to improve circuit performance. For example, the plating process is easily adapted to alter the thickness of conductors, and the location or number of wire bonds is easily changed without substantially interfering with the package manufacturing and assembly process.

Overall, the package is easily mass-produced by low energy mechanical, electrical and chemical techniques. The package induces minimum losses to the applied signal. The package is built in an array such that maximum index speed of die attach and wire bond machines can be used. And the assembly of the package on an external circuit is fast and accurate.

BRIEF DESCRIPTION OF THE DRAWINGS

FIG. 7b is a top view of the partially built alternate package array of FIG. 7a showing plated and trimmed metal conductors, die supports and wire bond pads.

DETAILED DESCRIPTION OF THE PREFERRED EMBODIMENT

Figure 1:
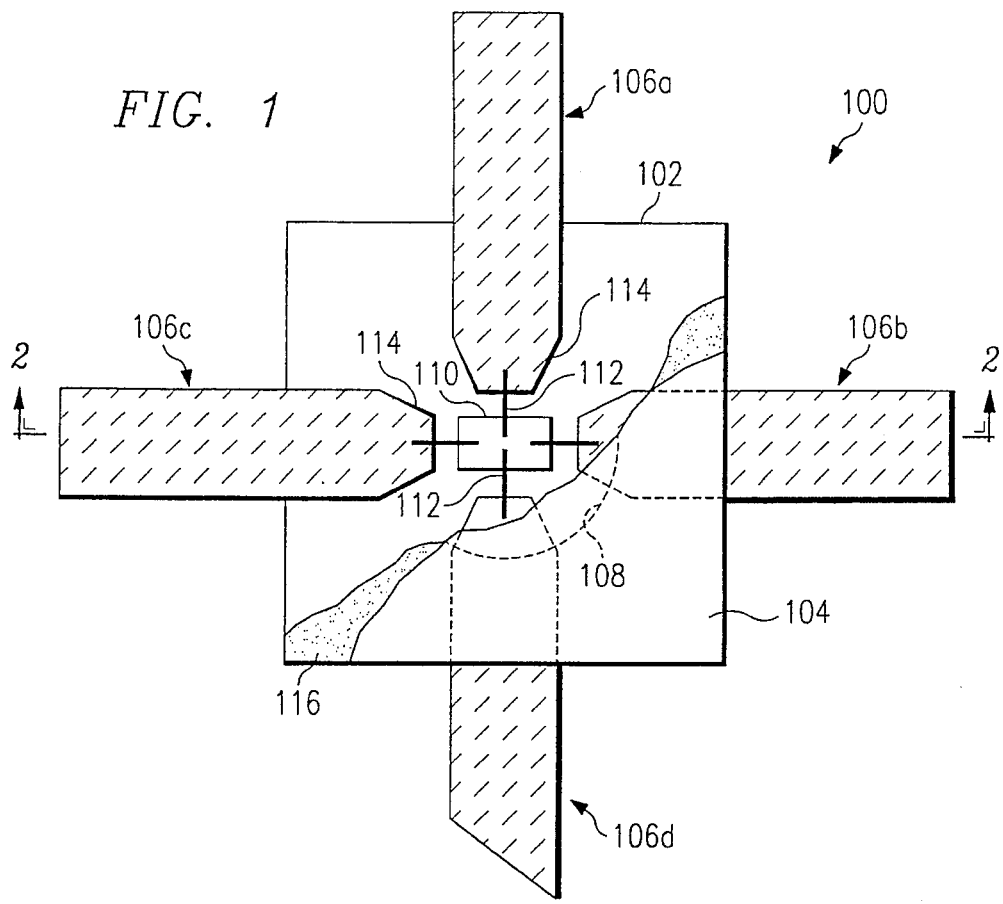
FIG. 1 is a top view of a package for a very high frequency FET with its lid partially cut-away to reveal details of the interior of the package with additional details under the lid indicated in phantom with dashed lines.

Referring now to FIG. 1, shown is top view of a package 100, formed from plastic, to support a semiconductor device, such as a high frequency field effect transistor (FET), used in high frequency circuit applications. The plastic material is easily machined, punched, cold formed or molded. The package includes a base 102, a lid 104 (shown in cut-away view), and metal conductors 106a–106d for electrically connecting the package to an external circuit (not shown). The end conductor 106d is clipped to allow keying the package to a circuit board, ensuring correct orientation of the package. Indicated in phantom by dashed lines, a cavity 108 is formed on the underside of lid 104 for accommodating die 110 and bond wires 112. On die 110 is mounted a microelectronic circuit (not shown in detail). A surface portion 114, called a pad, of each of the metal conductors 106 is located within the cavity 108. The pads are precisely located using photo-resist to plate and etch the metal to exact dimensions. Wire 112 electrically connects the die 110 to pads 114, thereby enabling the die to be electrically connected to an external circuit by means of conductors 106. A line of epoxy 116 bonds the package base 102 and the lid 104 to seal package 100 from the environment.

Figure 2:
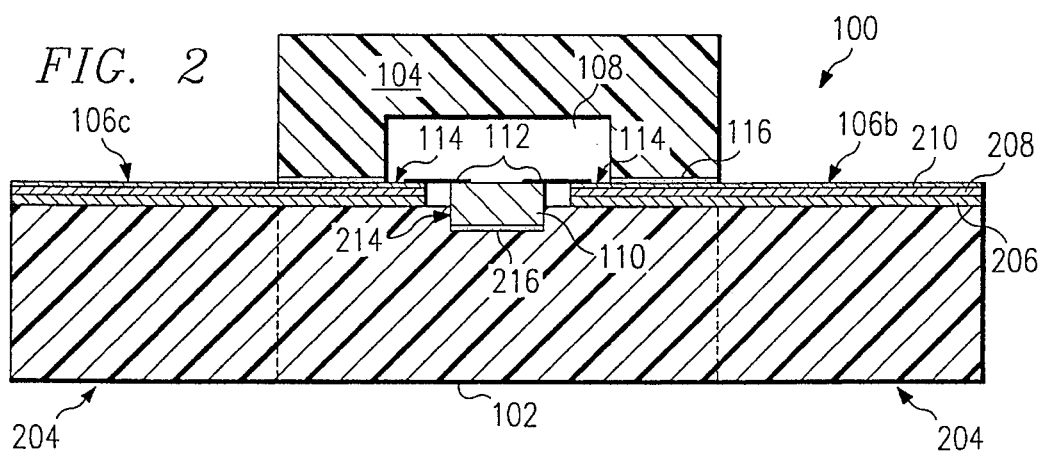
FIG. 2 is a cross-section of the package of FIG. 1 taken along section line 2—2.

Referring now to FIG. 2, a cross section of a package 100 taken along section line 2—2 as shown in FIG. 1 illustrates that the conductor supports 204, on which metal is deposited to form conductors 106, are integrally formed with base 102. The base 102 and the conductor supports 204 are composed of a plastic material that is easily platable with metal. The metals are applied in layers to the top and to the sides (not shown in the cross-sectional view) of the conductor supports 204 for forming conductors 106. The total thickness of the metal is chosen to match the operational frequency of the device or circuit on the die and can be controlled with various well known metallization processes from 0.05 millimeter to 4 millimeters. The width of each conductor is also chosen to match the device or the circuit on the die to the external circuit at the intended operational frequency of the die. The width can be chosen from 1 millimeter to 50 millimeters. On the bottom is a copper layer 206 having a thickness of 0.05 millimeter to 1 millimeter. A nickel layer 208, having a thickness of 0.01 millimeter to 0.1 millimeter is applied over copper layer 206 in order to seal the copper and prevent oxidation, ionic migration or other degradation of the copper. A gold layer 210, having a thickness of 0.01 millimeter to 0.1 millimeter is applied over the nickel layer 208 to provide a suitable surface for gold wire wedge or ball bonding during electrical connection of the die. The three layers of metal extend across the top surface of the base 102 to form pads 114. The pads are in close proximity to die 110 and provide sites for wire bonds that electrically connect the die to the conductors. Base 102 also includes a depression 214 to allow the die 110 to nest inside the base such that the top surface of the die is essentially coplanar to the pads. The die is mechanically bonded to the base with an adhesive 216, such as thermo-set epoxy or silicone adhesive. Bond wires 112, such as 0.025 millimeter diameter soft gold filament wire, electrically connects the device or microcircuit on the die to the pads 114. The number and connected length of bond wires can be optimized to minimize parasitic capacitances and inductances and to match to the impedance of the die. Having the surface of die 110 and the metal conductors 106 substantially coplanar allows for preferred minimum length bond wires. The lid is attached with an adhesive 116, such as epoxy, which covers and protects the die and wire bonds from the environment.

Figure 3:
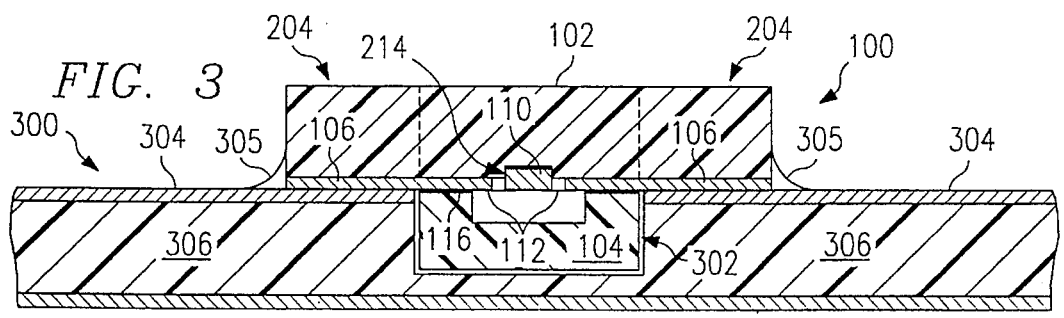
FIG. 3 is a cross-section of the package of FIG. 1, containing a very high frequency FET, mounted to a circuit board.

Referring now to FIG. 3, package 100 is mounted on an external circuit 300 previously formed on circuit board 306 by flipping the package 100 over and inserting lid 104 into a hole 302 defined through the top of circuit board 306. The hole 302 has dimensions only slightly larger than the lid to create a relatively close fit between the lid and the hole and for allowing metal conductors 106 good and complete contact with circuit conductors 304 of circuit 300. Solder 305 is reflowed on circuit conductors 304 and package conductors 106 during mounting of the package 100 so as to provide a mechanical bond of package 100 to the circuit 300 and to provide good electrical contact between the circuit conductors 304 and package conductors 106. The geometry of the package 100 and its mounting to the circuit board 300 provide a preferred co-planar signal path which reduces radiation losses through the assembled circuit board 300. Inserting lid 104 into hold 302 also registers the package 100 to the circuit board 304. Mounting the package in this manner registers it to circuit board and thus provides precise placement of the package on the printed circuit board and holds the package in place during solder reflow. This helps assure consistent performance and aids in mass production of the circuit assembly. Overall, package 100 provides simple installation and interconnection such that it can be used in many other external circuit geometries and is therefore not limited to use in only co-planar or in-hole applications.

Figure 4:
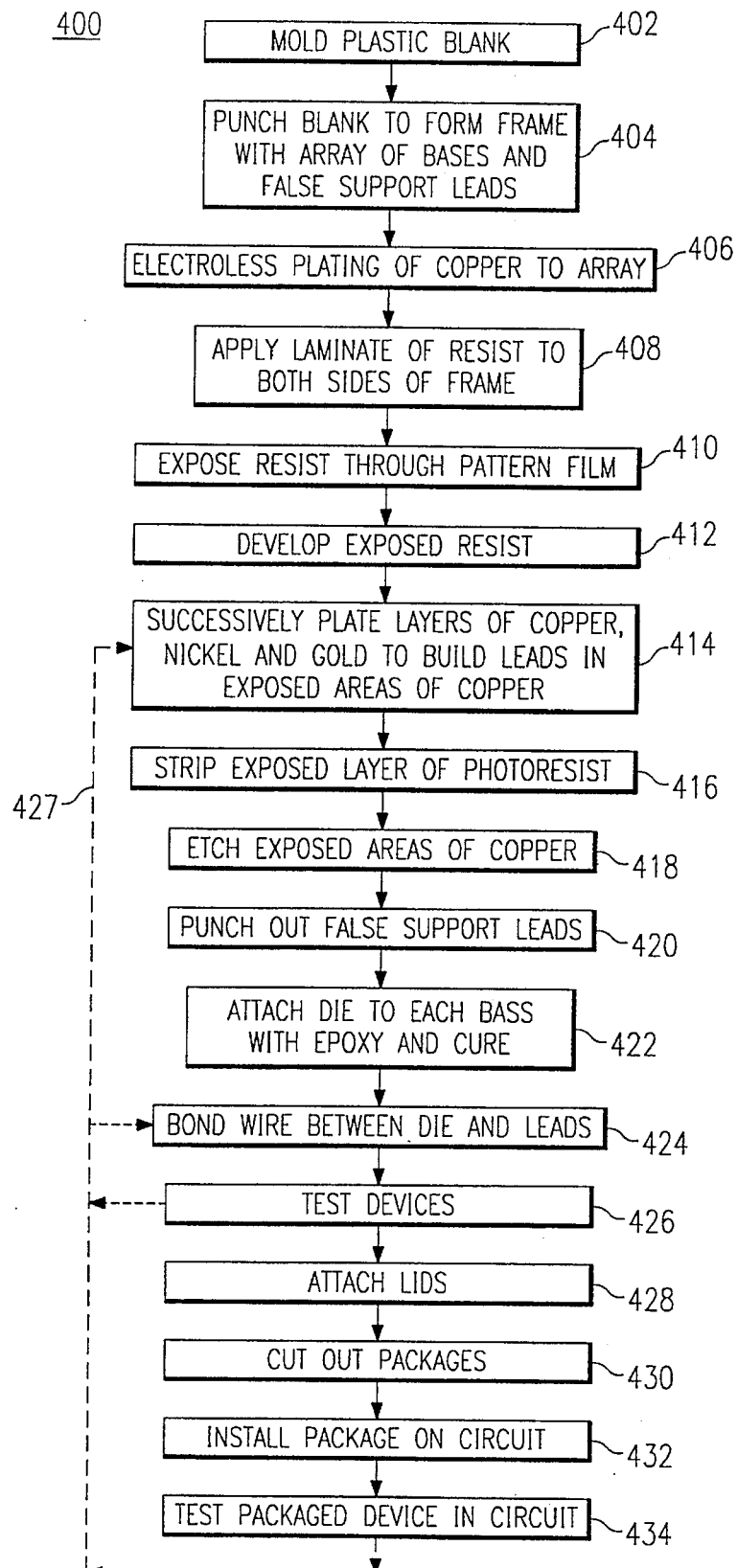
FIG. 4 is a flow diagram of process steps for the manufacture, assembly, test and installation of a package to an external circuit.

Referring now to FIG. 4, the packages are fabricated and assembled as part of an array, according to the process illustrated by flow diagram 400, in order to mass produce packages, thereby reducing manufacturing costs and providing other benefits mentioned herein. Plastic material is the preferred material for forming the package because of low material cost and ease of forming. Plating of metal conductors onto the package provides low cost, highly conductive electrical contacts. Building the packages in an array provides minimum equipment index time and maximum equipment dwell during die attach and wire bond operations. Testing in an array also has superior equipment process times.

Figure 5A:
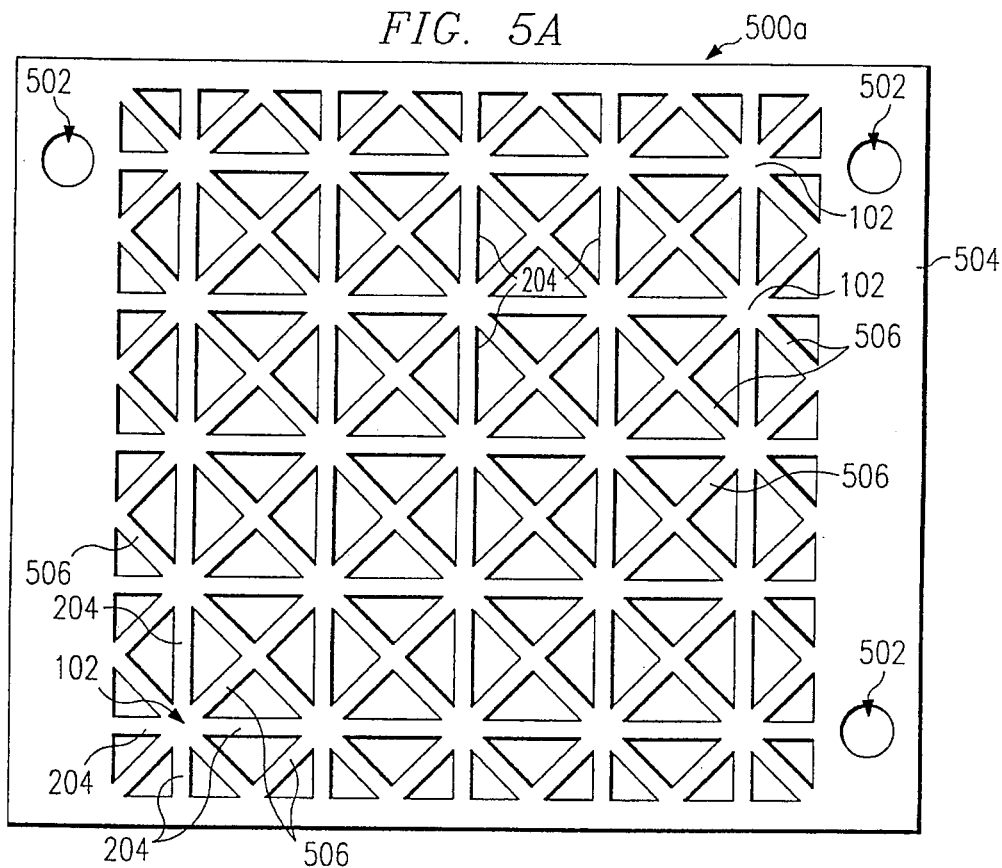
FIG. 5a is a top view of a partially built package array showing the integrally formed base and conductor supports formed by punching a sheet of platable plastic.

At step 402, a plastic blank is molded using conventional processes. Referring now to FIGS. 4 and 5A together, at step 404, the blank is punched to form array 500a of bases 102 with integrally formed and connected conductor supports 204. Alternately, the array can be machined. As an alternative to steps 402 and 404, the array can also be injection molded. Tooling holes 502 are provided in square frame 504 for alignment of packages during subsequent operations to enable close tolerance assembly. False supports 506 extending between bases 102 or between the bases and the frame are provided to restrict metal deposition on the base sides during subsequent plating operations.

Using plastic has several advantages. Package fabrication takes place at low temperatures relative to the temperature required for traditional ceramic packaging. No refractory processing is involved. Plastic is much more easily manipulatable or machinable than ceramic. Plastics encompass materials having a range of favorable properties, for example dielectric constants. This availability allows choosing a plastic that matches the device being packaged and thus easy customizing of the package for each device. Many of these plastics also have good dimensional stability. This stability enables precise location of conductor supports 204 during the punching, machining or molding of the array, as well as subsequent location of die on the base and automated wire bonding of the die to the package leads during process steps that will be described. Finally, conductors may be formed on plastic using a photographic process, rather than the conventional silk-screening process used for ceramic packages. The photographic process provides much finer control and precision, resulting in conductors manufactured to closer tolerances and thus better, more consistent package performance.

Glass filled poly-ether-imide is one such plastic. Ceramic filled poly-ether-imide is a better conductor of heat, but tends to be more brittle and thus difficult to work with.

Figure 5B:
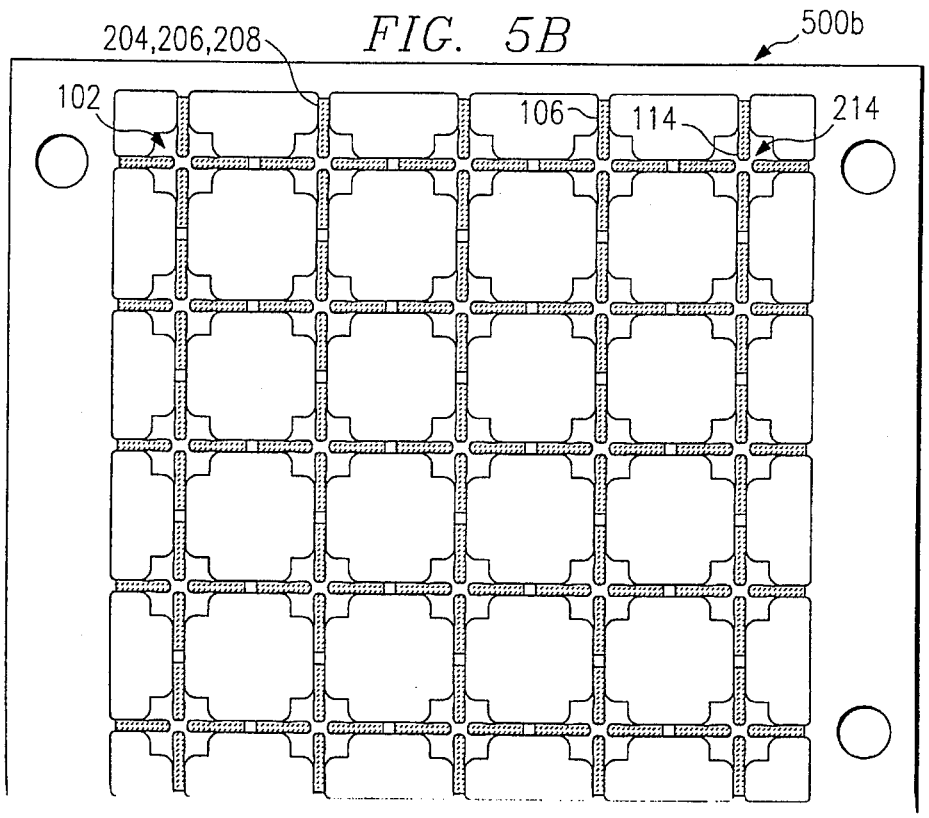
FIG. 5b is a top view of the partially built package array of FIG. 5a showing plated and trimmed metal conductors, die supports and wire bond pads.

Referring now to FIGS. 4 and 5B, Metal conductors 106 are next plated onto the array 500a. The plating starts with an additive process at step 406. All surfaces of the base and conductor supports are metallized with a copper cladding using a method as such as electroless plating. The copper cladding provides an electrical ground plane for subsequent plating operations. An alternate method of providing a ground plane is carbon activation or vapor deposition. However, removing the carbon ground plane is more difficult than etching away copper, resulting in greater risk of shorts between package conductors developing. At step 408, a wet or dry photo-resist is then applied or laminated to each side of the array 500A at a thickness of 0.25 to 1 millimeters, depending of the final, desired thickness of the metal conductors 106. At step 410, the photoresist on each side of the array is exposed with collimated light through a film having the conductor pattern formed thereon. The exposed photoresist is then developed and removed at step 412 to reveal the areas of the copper cladding on which conductors 106 will be formed. Different film patterns may be used to form different conductor geometries or configurations (for example conductor widths) without substantially changing the process of flow diagram 400 or the array 500A. Thus, packages to match other devices, such as those having different impedances or operating frequencies for example, may be inexpensively and quickly designed and fabricated.

At step 414, heavy metal is plated to the revealed underlying copper cladding inside the unexposed areas of the photo-resist, where the exposed photoresist has been developed and removed. First, using a copper bath, a copper layer is plated to the desired thickness, forming copper layer 206 of FIG. 2. Then, nickel is plated on top of the copper layer by immersing the array in a nickel bath and, in a similar process, a gold is plated over the nickel layer, resulting in nickel layer 208 and gold layer 210 of FIG. 2 for the conductors 106.

Next, to finish the conductors, a subtractive portion of the process is begun at step 416. The exposed photo-resist is stripped to reveal unplated copper cladding. The conductors 106 are then formed into a final configuration in step 418 by etching away the unplated copper cladding with a copper etchant and revealing the plastic base 102. This additive-subtractive process is precisely controlled to provide close tolerance conductors and requires substantially less energy than other metallizing processes, for example those used to metallize ceramic packaging.

After plating to form conductors 106, array 500b assumes the form shown by punching out false supports 506 at step 420. Punching out the false supports breaks the electrical connection between adjacent conductors on each base formed by metal plated along the sides of false supports due to the two-dimensional photoresist process.

At step 422, the die attach depression 214 is added by pressing a recess into the base area and the die attached to the base. A small amount of epoxy is applied to each die attach area on the base, in a quantity small enough so that the epoxy does not spread across the conductors when the die is attached. A pick and place machine then places each die on the epoxy. An automatic wire bonding machine then, at step 424, bonds wire between each conductor and die.

Before placing lids over each of the die, at step 428, each die is tested at step 426. The results of the test are feedback to plating step 414 and to step 424, as indicated by dashed lines 427, to provide on-line process control. The information allows adjustments to plating thicknesses and the length or number of wire bonds should the packaged devices not be meeting desired performance characteristics. At step 428, attaching the lids involves using a pick and place machine to pick a lid, place the bottom of it in a shallow pool of epoxy, and then place it over the die, as shown in FIG. 1. The lids may be fabricated in a mold or machined from a solid piece of plastic. The lid may also be cold pressed by, for example, pressing a blister in a strip of plastic to form the cavity for the lid.

After package assembly the complete package 100 is punched out at step 430 with one lead clipped at an angle for orientation as shown in FIG. 1. The packages are sorted and loaded for automatic testing using a standard external circuit. As indicated by dash line 427, testing information from the circuit on which the device has been installed is returned to plating step 414 and wire bonding step 424 to be used by plating and wire bonding processes to make any necessary adjustments. The package is then ready for installation on a circuit board at step 432 in the manner, for example, shown by FIG. 3. Packages can be surface mounted similar to standard pick and place with solder reflow methods for high volume, machine assisted assembly.

Figure 6:
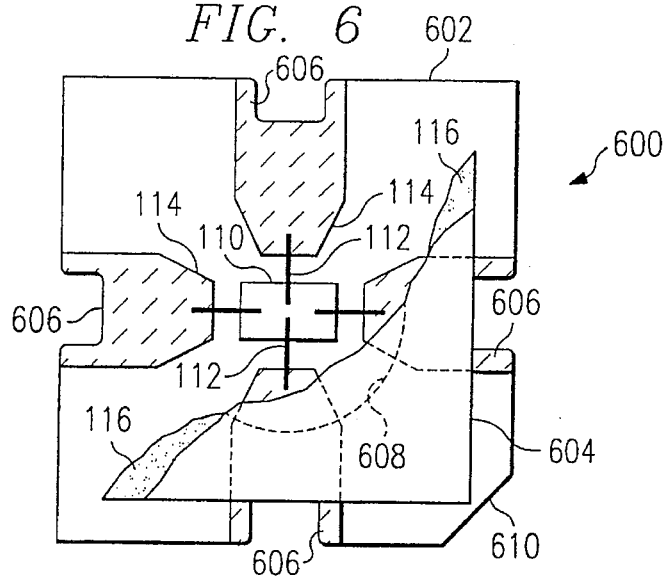
FIG. 6 is a top view of an alternate package configuration with its lid partially cut away.

Referring now to FIG. 6, shown is top view of an package 600 similar to, but having a lead configuration different from, package 100 in FIG. 1. Like package 100, package 600 is formed from plastic in a process substantially similar to that illustrated by FIG. 4, to support a semiconductor device, such as a FET, used in high frequency circuit applications. Package 600 includes a plastic base 602, a lid 604 (shown in cut-away view), and metal conductors 606 for electrically connecting the package to an external circuit (not shown). Indicated in phantom, a cavity 608 is formed on the underside of lid 604 for accommodating die 110 and bond wires 112. Pads 114 on each conductor 606 are located within the cavity 608. Wire 112 electrically connects the die 110 to pads 114, thereby enabling the die to be electrically connected to an external circuit by means of conductors 606. A bond line of epoxy 116 exists between the package base 602 and the lid 604 such that the package 600 is sealed from the environment.

Figure 7A:
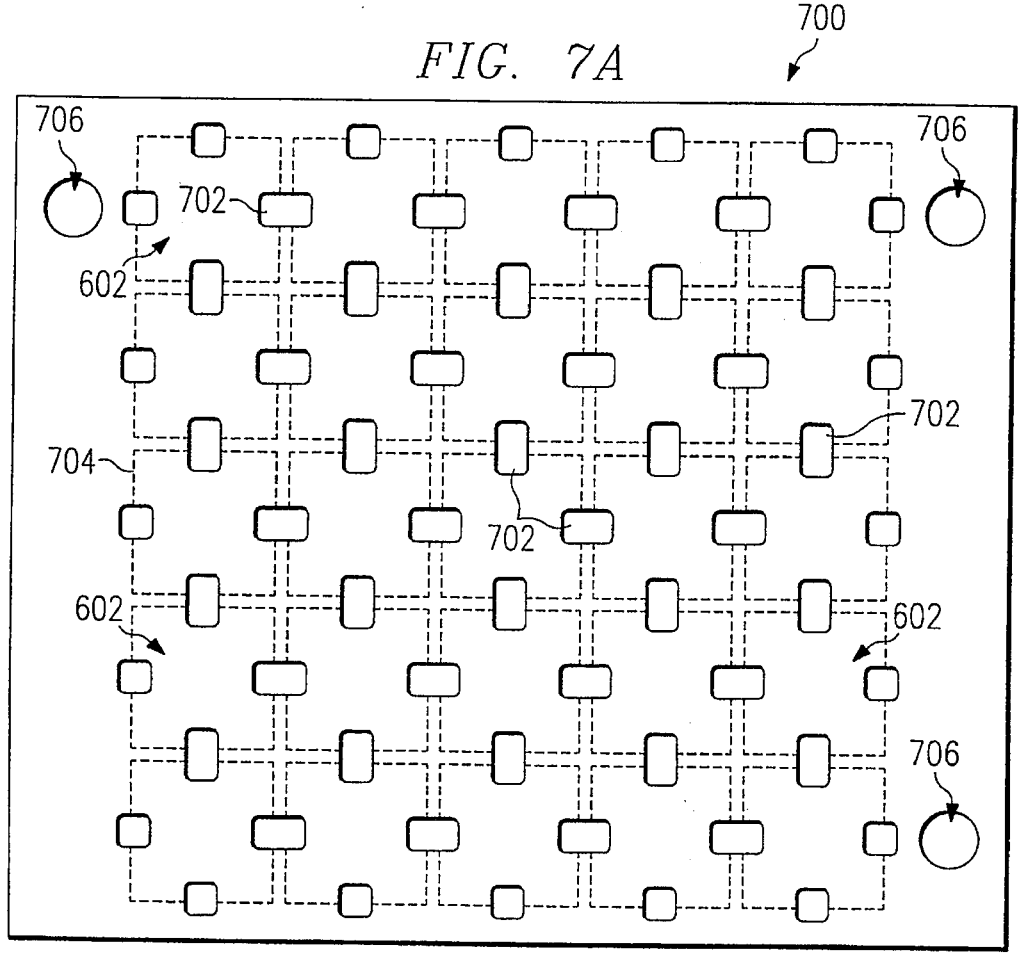
FIG. 7a is a top view of a partially built alternate package array showing the integrally formed base and conductor supports formed by punching a sheet of platable plastic.

Referring now to FIG. 7A, the process of fabricating and assembling package 600 differs from that of package 100, as depicted by FIG. 4, mainly in the configuration of the array of bases and the conductors. An array 700a is formed by micro-milling or punching a plastic blank with an array of generally rectangular slots 702. Dashed lines 704 indicate the periphery of bases 602, where the array will be cut to remove the individual packages. Tooling holes 706 are also provided.

Referring now to FIG. 7B, the array is metallized with conductors 606 in the manner described at steps 406 to 418 in FIG. 4. The die is attached and wire bonded to the conductors in the same manner as described in steps 422 and 424. Step 420 is unnecessary as there are false leads to punch out. Following steps 428–432 of FIG. 4, the packages are tested, the lids attached and then cut out along dashed lines 704. One corner of the base is dipped at an angle for orientation as in 610.

Only the preferred embodiments of the invention have been described. Modifications to these embodiments are possible without departing from the spirit and scope of the invention as set forth in the appended claims.

What is claimed is:

1. A package for semiconductor device operating at very high frequencies, the package comprising:

(a) a base having a surface for receiving a semiconductor die and a supporting metal conductor, the base being integrally formed from plastic;

(b) a low-resistance planar metal conductor on the top surface of the base for electrically connecting the package to a printed circuit board plated to the lead support, the metal conductor formed by plating metal to the base;

(c) a semiconductor die attached to the top surface of the base substantially adjacent and electrically bonded with wire to the metal conductor, wherein the bond wires have substantially minimum length to minimize parasitic losses, the bond wires and the conductors lie substantially in the same plane to reduce abrupt changes in physical path of a high frequency signal travelling between the metal conductor and the die; and (d) a lid for covering the semiconductor die.

2. The package of claim 1 wherein the package is electrically connected to a planar conductor on the surface of a printed circuit board by inserting the lid of the package into a hole formed in the surface of the printed circuit board; the metal conductor extends beyond the lid on the top surface of the base so as to make electrical contact with the conductor on the printed circuit board; and the conductor on the printed circuit board, the conductor of the package, the bond wires and the surface of the die are substantially coplanar to reduce abrupt changes in a physical path of current flow from the conductor on the printed circuit board to the die.

3. The package of claim 1 wherein the base is fashioned from the plastic material at non-refractory temperatures by punching, machining, molding or cold-forming.

4. The package of claim 1 wherein the base is formed from poly-ether-imide and the semiconductor die is sufficiently small to withstand mechanical stresses caused by the poly-ether-imide and the semiconductor material having different thermal rates of expansion.

5. The package of claim 1 further including a dimple in the top surface of the base, wherein the semiconductor die is attached within the dimple to lower the surface of the die so as to be substantially coplanar with the metal conductor.

6. The package of claim 1 wherein the base of the package is part of an array of a plurality of inter-connected bases of other packages; the array of bases being integrally formed and the packages assembled in an array form.

7. A package for a high frequency semiconductor device comprising:

(a) a platable plastic base having a surface for receiving said high frequency semiconductor device;

(b) plating applied to said base having a thickness and width to match the electrical properties of the high frequency semiconductor device.

8. The package of claim 7 further comprises:

(c) a lid attached to said base over said semiconductor device.

9. The package of claim 8 wherein said semiconductor device is isolated from said lid.

10. The package of claim 8 wherein said plating comprises a first layer clad onto the plastic base.

11. The package of claim 10 further comprises at least one additional layer of metal applied by a photographic process.

12. The package of claim 11 wherein said at least one additional layer is a wire bondable connector.

13. A package for a high frequency semiconductor device comprising:

(a) a platable plastic base for accepting said semiconductor device;

(b) plating applied to said plastic base, wherein said plating forms a wire bondable connector.

14. The package of claim 13 wherein said package is leadless.

15. The package of claim 13 wherein said wire bondable connector is gold.

* * * * *